United States Patent
Yew et al.

(10) Patent No.: US 9,548,281 B2
(45) Date of Patent: Jan. 17, 2017

(54) ELECTRICAL CONNECTION FOR CHIP SCALE PACKAGING

(75) Inventors: Ming-Chih Yew, Hsin-Chu (TW);
Wen-Yi Lin, New Taipei (TW); Fu-Jen Li, Hsin-Chu (TW); Po-Yao Lin, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/269,310

(22) Filed: Oct. 7, 2011

(65) Prior Publication Data

US 2013/0087892 A1 Apr. 11, 2013

(51) Int. Cl.
*H01L 23/48* (2006.01)
*H01L 21/28* (2006.01)
(Continued)

(52) U.S. Cl.
CPC ........... *H01L 24/06* (2013.01); *H01L 23/3157* (2013.01); *H01L 23/525* (2013.01); *H01L 24/05* (2013.01);
(Continued)

(58) Field of Classification Search
CPC ............ H01L 2224/13014; H01L 2224/13012; H01L 2224/0401; H01L 2224/05015; H01L 2224/05552; H01L 2224/05555; H01L 2224/73203; H01L 24/02; H01L 24/06; H01L 24/10; H01L 24/17; H01L 24/81; H01L 2225/06513; H01L 23/12; H01L 23/48; H01L 23/485; H01L 23/488; H01L 23/498; H01L 23/52; H01L 23/522; H01L 23/58; H01L 21/24; H01L 21/28; H01L 21/40; H01L 21/50; H01L 21/56; H01L 21/60; H01L 21/768; H01L 29/40; H01L 29/41; H01L 29/72; B81B 7/0006; H05K 7/06
(Continued)

(56) References Cited

U.S. PATENT DOCUMENTS 5,859,474 A    1/1999  Dordi
5,898,223 A *  4/1999  Frye ................... H01L 23/5221
                                                                257/738
(Continued)

FOREIGN PATENT DOCUMENTS

CN    101582406    11/2009
CN    101636831    1/2010
(Continued)

OTHER PUBLICATIONS

Hayashi et al., Partial Translation for JP02170548 for Fig. 1 and Fig. 2, 2013, p. 9.*

(Continued)

*Primary Examiner* — Julia Slutsker
*Assistant Examiner* — Natalia Gondarenko
(74) *Attorney, Agent, or Firm* — Slater Matsil, LLP

(57) ABSTRACT

A system and method for providing a post-passivation opening and undercontact metallization is provided. An embodiment comprises an opening through the post-passivation which has a first dimension longer than a second dimension, wherein the first dimension is aligned perpendicular to a chip's direction of coefficient of thermal expansion mismatch. By shaping and aligning the opening through the post-passivation layer in this fashion, the post-passivation layer helps to shield the underlying layers from stresses generated from mismatches of the materials' coefficient of thermal expansion.

20 Claims, 6 Drawing Sheets

(51) Int. Cl.
*H01L 23/00* (2006.01)
*H01L 23/488* (2006.01)
*H01L 23/31* (2006.01)
*H01L 23/525* (2006.01)

(52) U.S. Cl.
CPC ........ *H01L 24/13* (2013.01); *H01L 2224/0401* (2013.01); *H01L 2224/05008* (2013.01); *H01L 2224/05012* (2013.01); *H01L 2224/05022* (2013.01); *H01L 2224/05541* (2013.01); *H01L 2224/05552* (2013.01); *H01L 2224/05555* (2013.01); *H01L 2224/05569* (2013.01); *H01L 2224/05572* (2013.01); *H01L 2224/061* (2013.01); *H01L 2224/06137* (2013.01); *H01L 2224/06179* (2013.01)

(58) Field of Classification Search
USPC ........ 257/737–738, 786, 773–775, 778–784, 257/621, 632, 685, 741; 438/108, 540, 612, 438/613, 617, 637, 666, 675
See application file for complete search history.

(56) References Cited

U.S. PATENT DOCUMENTS

| | | | |
|---|---|---|---|
| 6,181,569 B1 | 1/2001 | Chakravorty | |
| 6,268,568 B1* | 7/2001 | Kim | .................. 174/250 |
| 6,294,840 B1 | 9/2001 | McCormick | |
| 6,339,534 B1 | 1/2002 | Coico et al. | |
| 6,774,474 B1 | 8/2004 | Caletka et al. | |
| 6,841,853 B2* | 1/2005 | Yamada | .................. 257/666 |
| 6,841,875 B2* | 1/2005 | Ohsumi | .................. 257/738 |
| 6,864,565 B1 | 3/2005 | Hool et al. | |
| 6,913,948 B2 | 7/2005 | Caletka et al. | |
| 6,927,498 B2* | 8/2005 | Huang et al. | .................. 257/786 |
| 6,998,532 B2 | 2/2006 | Kawamoto et al. | |
| 7,125,748 B2 | 10/2006 | Grigg et al. | |
| 7,160,805 B1 | 1/2007 | Burke et al. | |
| 7,397,121 B2 | 7/2008 | Chou et al. | |
| 7,408,260 B2 | 8/2008 | Fjelstad et al. | |
| 7,550,837 B2 | 6/2009 | Kimura et al. | |
| 7,638,881 B2 | 12/2009 | Chang et al. | |
| 7,863,742 B2 | 1/2011 | Yu et al. | |
| 7,872,344 B2 | 1/2011 | Fjelstad et al. | |
| 7,893,524 B2 | 2/2011 | Sunohara et al. | |
| 7,934,313 B1 | 5/2011 | Lin et al. | |
| 8,084,871 B2 | 12/2011 | Rahim et al. | |
| 8,119,927 B2 | 2/2012 | Yoda et al. | |
| 8,227,918 B2* | 7/2012 | Lu | ............ H01L 24/05 257/738 |
| 8,227,926 B2 | 7/2012 | Topacio et al. | |
| 8,232,641 B2 | 7/2012 | Ozawa et al. | |
| 8,324,740 B2 | 12/2012 | Hagihara | |
| 8,405,211 B2 | 3/2013 | Tsai et al. | |
| 8,445,355 B2 | 5/2013 | Abou-Khalil et al. | |
| 8,624,392 B2 | 1/2014 | Yew et al. | |
| 8,829,673 B2 | 9/2014 | Cha et al. | |
| 2002/0155637 A1 | 10/2002 | Lee | |
| 2002/0164836 A1 | 11/2002 | Ho | |
| 2003/0151140 A1 | 8/2003 | Nishiyama et al. | |
| 2003/0222353 A1 | 12/2003 | Yamada | |
| 2003/0227025 A1 | 12/2003 | Ochi et al. | |
| 2004/0026782 A1 | 2/2004 | Anzai | |
| 2004/0053483 A1* | 3/2004 | Nair | .................. H01L 21/2885 438/540 |
| 2004/0125577 A1 | 7/2004 | Vinciarelli et al. | |
| 2004/0132230 A1 | 7/2004 | Kim | |
| 2004/0212054 A1 | 10/2004 | Maxwell et al. | |
| 2004/0227225 A1 | 11/2004 | Fjelstad et al. | |
| 2005/0013082 A1 | 1/2005 | Kawamoto et al. | |
| 2005/0087364 A1* | 4/2005 | Umemoto | ......... H01L 23/49816 174/260 |
| 2005/0142835 A1 | 6/2005 | Ball et al. | |
| 2005/0181545 A1 | 8/2005 | Grigg et al. | |
| 2005/0242436 A1* | 11/2005 | Abe et al. | .................. 257/737 |
| 2005/0253231 A1 | 11/2005 | Liu | |
| 2006/0160346 A1 | 7/2006 | Hori | |
| 2007/0069346 A1 | 3/2007 | Lin et al. | |
| 2007/0148951 A1 | 6/2007 | Pang et al. | |
| 2007/0200239 A1 | 8/2007 | Su | |
| 2008/0102620 A1 | 5/2008 | Sakaguchi | |
| 2008/0116588 A1 | 5/2008 | Van Kleef et al. | |
| 2008/0142994 A1* | 6/2008 | Lu et al. | .................. 257/778 |
| 2008/0182398 A1 | 7/2008 | Carpenter et al. | |
| 2008/0265413 A1 | 10/2008 | Chou et al. | |
| 2008/0298034 A1 | 12/2008 | Park et al. | |
| 2008/0308934 A1 | 12/2008 | Alvarado et al. | |
| 2009/0014869 A1* | 1/2009 | Vrtis et al. | .................. 257/737 |
| 2009/0096079 A1 | 4/2009 | Park | |
| 2009/0152721 A1 | 6/2009 | Huang et al. | |
| 2009/0174084 A1* | 7/2009 | Jadhav | .................. H01L 24/12 257/786 |
| 2009/0283903 A1 | 11/2009 | Park | |
| 2010/0117231 A1 | 5/2010 | Lang et al. | |
| 2010/0237491 A1 | 9/2010 | Park et al. | |
| 2010/0237506 A1 | 9/2010 | Brunnbauer et al. | |
| 2010/0283148 A1* | 11/2010 | Tsai et al. | .................. 257/737 |
| 2011/0074041 A1* | 3/2011 | Leung et al. | .................. 257/774 |
| 2011/0101519 A1 | 5/2011 | Hsiao et al. | |
| 2011/0101526 A1 | 5/2011 | Hsiao et al. | |
| 2011/0198753 A1 | 8/2011 | Holland | |
| 2011/0227216 A1 | 9/2011 | Tseng et al. | |
| 2011/0228464 A1 | 9/2011 | Guzek et al. | |
| 2011/0248398 A1 | 10/2011 | Parvarandeh et al. | |
| 2011/0254154 A1 | 10/2011 | Topacio et al. | |
| 2012/0032337 A1 | 2/2012 | Lu et al. | |
| 2012/0049343 A1 | 3/2012 | Schulze et al. | |
| 2012/0086123 A1 | 4/2012 | Park et al. | |
| 2012/0098120 A1 | 4/2012 | Yu et al. | |
| 2012/0205813 A1 | 8/2012 | Lin et al. | |
| 2012/0228765 A1 | 9/2012 | Alvarado et al. | |
| 2013/0026622 A1 | 1/2013 | Chuang et al. | |
| 2013/0062741 A1 | 3/2013 | Wu et al. | |
| 2013/0062755 A1 | 3/2013 | Kuo et al. | |
| 2013/0093079 A1 | 4/2013 | Tu et al. | |
| 2013/0147030 A1 | 6/2013 | Chang et al. | |
| 2013/0221522 A1 | 8/2013 | Chen et al. | |
| 2013/0228897 A1 | 9/2013 | Chen et al. | |
| 2014/0035148 A1 | 2/2014 | Chuang et al. | |
| 2014/0113447 A1 | 4/2014 | Yew et al. | |
| 2014/0377946 A1 | 12/2014 | Cha et al. | |
| 2015/0097287 A1 | 4/2015 | Chen et al. | |
| 2015/0235976 A1 | 8/2015 | Yew et al. | |

FOREIGN PATENT DOCUMENTS

| | | |
|---|---|---|
| EP | 1107306 A1 | 6/2001 |
| JP | 02170548 A * | 7/1990 |
| JP | 11145199 | 5/1999 |
| JP | 2002280487 A | 9/2002 |
| KR | 1020100104377 | 9/2010 |
| TW | 201009963 | 3/2010 |
| WO | 2006008701 | 1/2006 |

OTHER PUBLICATIONS

Hayashi et al., Complete translation of JP02170548, 2013, translated by Schreiber Translations, Inc., pp. 1-17.*
Chen, Hsien-Wei et al., "Electrical Connections for Chip Scale Packaging," U.S. Appl. No. 14/571,068, Taiwan Semiconductor Manufacturing Company, Ltd., filed Dec. 14, 2014, 36 pages.

* cited by examiner

ELECTRICAL CONNECTION FOR CHIP SCALE PACKAGING

BACKGROUND

Generally, a semiconductor die may be connected to other devices external to the semiconductor die through a type of packaging utilizing solder bumps. The solder bumps may be formed by initially forming a layer of undercontact metallization on the semiconductor die and then placing solder onto the undercontact metallization. After the solder has been placed, a reflow operation may be performed in order to shape the solder into the desired bump shape. The solder bump may then be placed into physical contact with the external device and another reflow operation may be performed in order to bond the solder bump with the external device. In such a fashion, a physical and electrical connection may be made between the semiconductor die and an external device, such as a printed circuit board, another semiconductor die, or the like.

However, the material that comprises the undercontact metallization is merely one more type of material placed onto a stack of many different materials, such as dielectric materials, metallization materials, etch stop materials, barrier layer materials, and other materials utilized in the formation of the semiconductor die. Each one of these different materials may have a unique coefficient of thermal expansion that is different from the other materials. This type of coefficient of thermal expansion mismatch can cause problems if the semiconductor die is subjected to elevated temperatures.

BRIEF DESCRIPTION OF THE DRAWINGS

For a more complete understanding of the embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the embodiments provide many applicable inventive concepts that can be embodied in a wide variety of specific contexts. The embodiments discussed are merely illustrative of specific ways to make and use the embodiments, and do not limit the scope of the embodiments.

The embodiments will be described with respect to embodiments in a specific context, namely a post-passivation interconnect underlying an undercontact metallization. The embodiments may also be applied, however, to other metallization layers.

Figure 1:
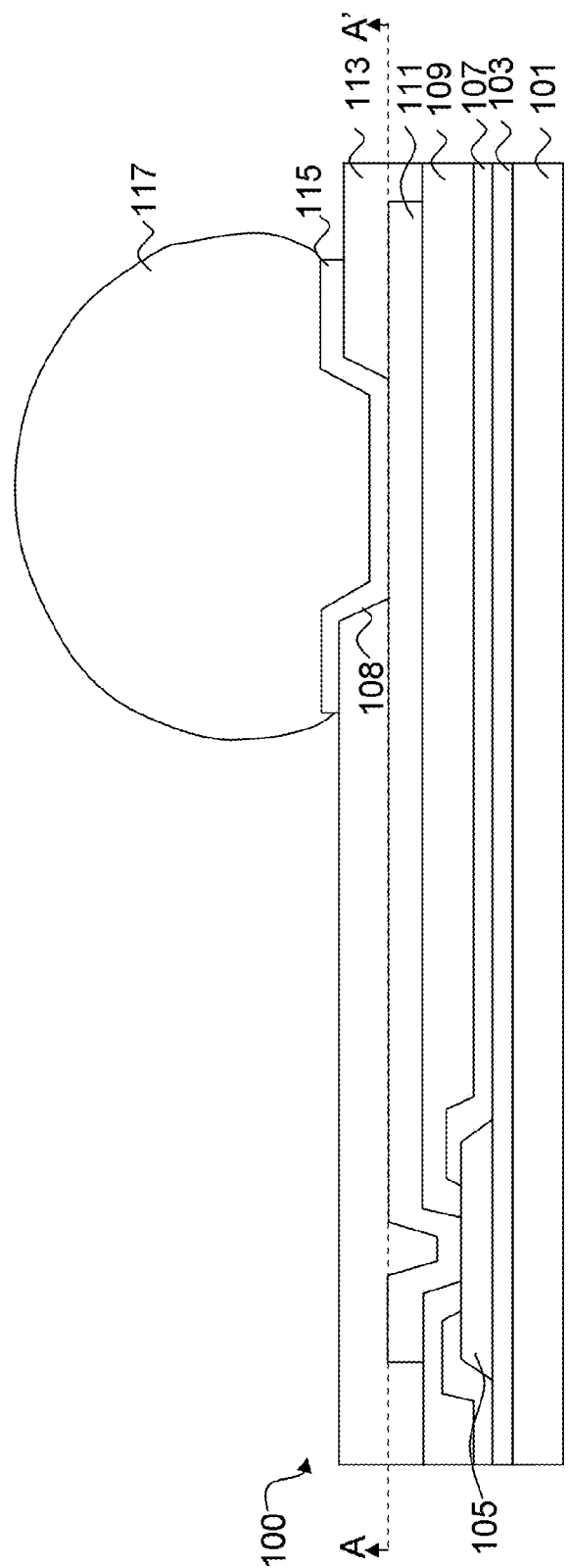
FIG. 1 illustrates a cross-sectional view of a post-passivation interconnect opening and undercontact metallization in accordance with an embodiment.

With reference now to FIG. 1, there is shown a portion of a semiconductor die 100 including a semiconductor substrate 101 with metallization layers 103, a contact pad 105, a first passivation layer 107, a second passivation layer 109, a post-passivation interconnect (PPI) 111, a PPI opening 108, a third passivation layer 113, an undercontact metallization (UCM) 115, and a connector 117. The semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Active devices (not shown) may be formed on the semiconductor substrate 101. As one of ordinary skill in the art will recognize, a wide variety of active devices such as capacitors, resistors, inductors and the like may be used to generate the desired structural and functional requirements of the design for the semiconductor die 100. The active devices may be formed using any suitable methods either within or else on the surface of the semiconductor substrate 101.

The metallization layers 103 are formed over the semiconductor substrate 101 and the active devices and are designed to connect the various active devices to form functional circuitry. While illustrated in FIG. 1 as a single layer, the metallization layers 103 may be formed of alternating layers of dielectric (e.g., low-k dielectric material) and conductive material (e.g., copper) and may be formed through any suitable process (such as deposition, damascene, dual damascene, etc.). In an embodiment there may be four layers of metallization separated from the semiconductor substrate 101 by at least one interlayer dielectric layer (ILD), but the precise number of metallization layers 103 is dependent upon the design of the semiconductor die 100.

The contact pad 105 may be formed over and in electrical contact with the metallization layers 103. The contact pad 105 may comprise aluminum, but other materials, such as copper, may alternatively be used. The contact pad 105 may be formed using a deposition process, such as sputtering, to form a layer of material (not shown) and portions of the layer of material may then be removed through a suitable process (such as photolithographic masking and etching) to form the contact pad 105. However, any other suitable process may be utilized to form the contact pad 105. The contact pad 105 may be formed to have a thickness of between about 0.5 µm and about 4 µm, such as about 1.45 µm.

The first passivation layer 107 may be formed on the semiconductor substrate 101 over the metallization layers 103 and the contact pad 105. The first passivation layer 107 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 107 may be formed through a process such as chemical vapor deposition (CVD), although any other suitable process may alternatively be utilized, and may have a thickness between about 0.5 μm and about 5 μm, such as about 9.25 KÅ.

After the first passivation layer 107 has been formed, an opening may be made through the first passivation layer 107 by removing portions of the first passivation layer 107 to expose at least a portion of the underlying contact pad 105. The opening allows for contact between the contact pad 105 and the PPI 111 (discussed further below). The opening may be formed using a suitable photolithographic mask and etching process, although any suitable process to expose portions of the contact pad 105 may be used.

The second passivation layer 109 may be formed over the contact pad 105 and the first passivation layer 107. The second passivation layer 109 may be formed from a polymer such as polyimide. Alternatively, the second passivation layer 109 may be formed of a material similar to the material used as the first passivation layer 107, such as silicon oxides, silicon nitrides, low-k dielectrics, extremely low-k dielectrics, combinations of these, and the like. The second passivation layer 109 may be formed to have a thickness between about 2 μm and about 15 μm, such as about 5 μm.

After the second passivation layer 109 has been formed, an opening may be made through the second passivation layer 109 by removing portions of the second passivation layer 109 to expose at least a portion of the underlying contact pad 105. The opening allows for contact between the contact pad 105 and the PPI 111 (discussed further below). The opening may be formed using a suitable photolithographic mask and etching process, although any suitable process to expose portions of the contact pad 105 may be used.

After the contact pad 105 has been exposed, the PPI 111 may be formed to extend along the second passivation layer 109. The PPI 111 may be utilized as a redistribution layer to allow the UCM 115 that is electrically connected to the contact pad 105 to be placed in any desired location on the semiconductor die 100, instead of limiting the location of the UCM 115 to the region directly over the contact pad 105. In an embodiment the PPI 111 may be formed by initially forming a seed layer (not shown) of a titanium copper alloy through a suitable formation process such as CVD or sputtering. A photoresist (not shown) may then be formed to cover the seed layer, and the photoresist may then be patterned to expose those portions of the seed layer that are located where the PPI 111 is desired to be located.

Once the photoresist has been formed and patterned, a conductive material, such as copper, may be formed on the seed layer through a deposition process such as plating. The conductive material may be formed to have a thickness of between about 1 μm and about 10 μm, such as about 5 μm, and a width along the substrate 101 of between about 5 μm and about 300 μm, such as about 15 μm. However, while the material and methods discussed are suitable to form the conductive material, these materials are merely exemplary. Any other suitable materials, such as AlCu or Au, and any other suitable processes of formation, such as CVD or PVD, may alternatively be used to form the PPI 111.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

Once the PPI 111 has been formed, the third passivation layer 113 may be formed to protect the PPI 111 and the other underlying structures. The third passivation layer 113, similar to the second passivation layer 109, may be formed from a polymer such as polyimide, or may alternatively be formed of a similar material as the first passivation layer 107 (e.g., silicon oxides, silicon nitrides, low-k dielectrics, extremely low-k dielectrics, combinations of these, and the like). The third passivation layer 113 may be formed to have a thickness of between about 2 μm and about 15 μm, such as about 5 μm.

After the third passivation layer 113 has been formed, a PPI opening 108 may be made through the third passivation layer 113 by removing portions of the third passivation layer 113 to expose at least a portion of the underlying PPI 111. The PPI opening 108 allows for contact between the UCM 115 and the PPI 111. The PPI opening 108 may be formed using a suitable photolithographic mask and etching process, although any suitable process to expose portions of the PPI 111 may alternatively be used.

Once the PPI 111 has been exposed through the third passivation layer 113, the UCM 115 may be formed in electrical contact with the PPI 111. The UCM 115 may, e.g., be an underbump metallization and may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UCM 115. Any suitable materials or layers of material that may be used for the UCM 115 are fully intended to be included within the scope of the current application.

The UCM 115 may be created by forming each layer over the third passivation layer 113 and along the interior of the PPI opening 108 through the third passivation layer 113. The forming of each layer may be performed using a plating process, such as electrochemical plating, although other processes of formation, such as sputtering, evaporation, or PECVD process, may alternatively be used depending upon the desired materials. The UCM 115 may be formed to have a thickness of between about 0.7 μm and about 10 μm, such as about 5 μm. Once the desired layers have been formed, portions of the layers may then be removed through a suitable photolithographic masking and etching process to remove the undesired material and to leave the UCM 115 in a desired shape, such as a circular, octagonal, square, or rectangular shape, although any desired shape may alternatively be formed.

The connector 117 may be a contact bump and may comprise a material such as tin, or other suitable materials, such as silver, lead-free tin, or copper. In an embodiment in which the connector 117 is a tin solder bump, the connector 117 may be formed by initially forming a layer of tin through such commonly used methods such as evaporation, electroplating, printing, solder transfer, ball placement, etc, to a thickness of, e.g., about 100 μm. Once a layer of tin has been formed on the structure, a reflow may be performed in order to shape the material into the desired bump shape.

Figure 2:
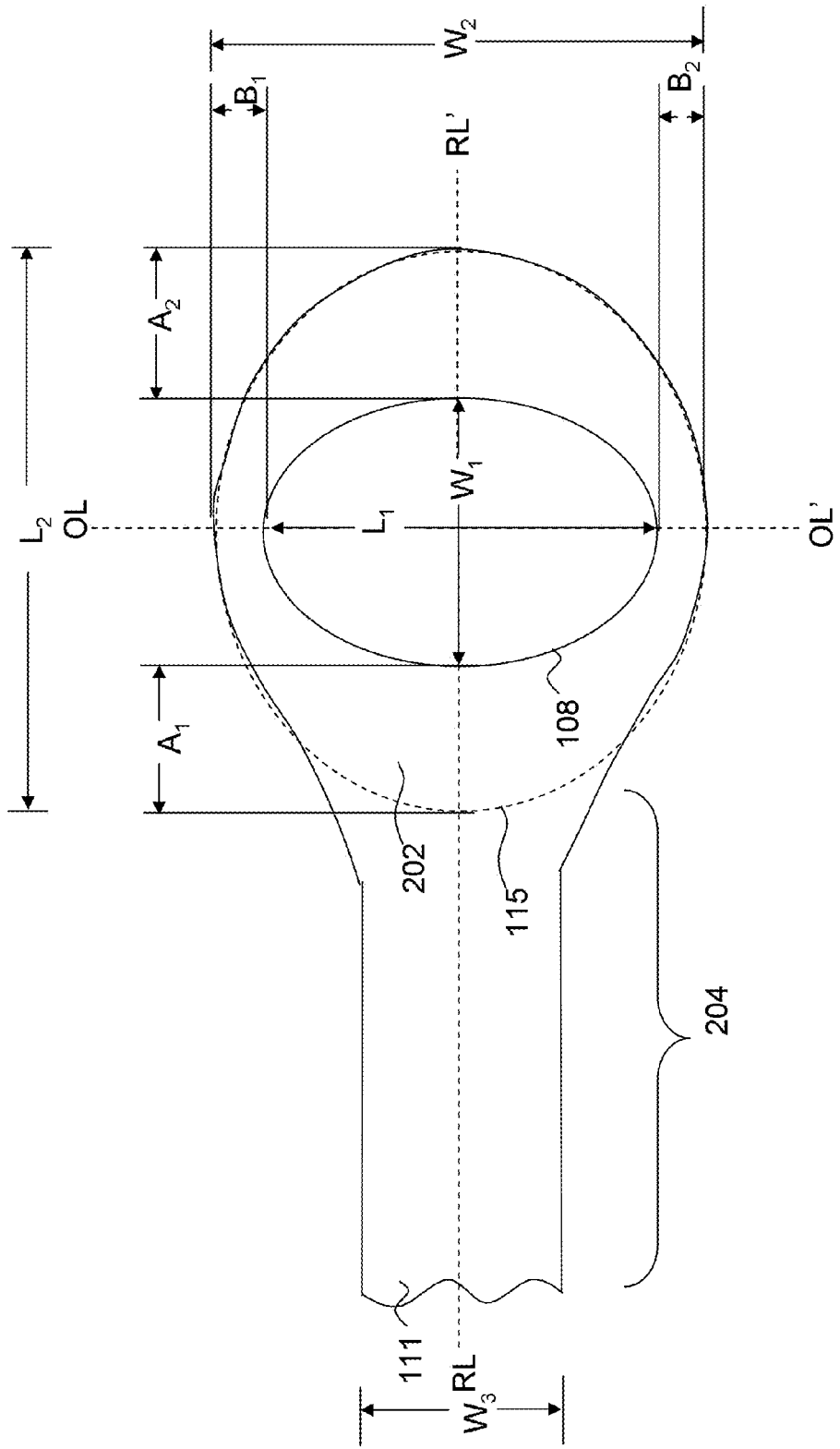
FIG. 2 illustrates a top-down view of the post-passivation interconnect opening and undercontact metallization in accordance with an embodiment.

FIG. 2 illustrates a top view of the PPI opening 108 and the UCM 115 overlying the PPI 111 along line A-A' (in FIG. 1). For clarity, the connector 117, the third passivation layer 113, and the layers underlying the PPI 111 have been removed from FIG. 2 in order to more clearly illustrate features of the embodiments. Additionally in this view, the UCM 115 within the PPI opening 108 and the PPI opening 108 itself share the same boundary.

As can be seen in this top-down view, the PPI opening 108 and the UCM 115 within the PPI opening 108 may have a first length $L_1$ along an opening longitudinal axis OL-OL' and a first width $W_1$ along an RDL longitudinal axis RL-RL'. In an embodiment the first length $L_1$ may be greater than the first width $W_1$, such that a larger amount of material from the third passivation layer 113 is located along the RDL longitudinal axis RL-RL' than with a circular opening. By placing a larger amount of the material of the third passivation layer 113 along the RDL longitudinal axis RL-RL', underlying layers (such as the metallization layers 103) may be shielded by the extra material from the third passivation layer 113 from stresses that may arise because of coefficient of thermal expansion mismatches along the RDL longitudinal axis RL-RL'. Additionally, by having the first width $W_1$ reduced in comparison to the first length $L_1$, the shielding provided by the extra material may be obtained along the first width $W_1$ without requiring a reduction in every dimension of the PPI opening 108 (such as the first length $L_1$), thereby helping to keep the contact resistance between the UCM 115 and the PPI 111 low while still allowing for the PPI opening 108 to help shield the underlying layers. In an embodiment the first length $L_1$ may be between about 50 μm and about 500 μm, such as about 200 μm, while the first width $W_1$ may be between about 30 μm and about 400 μm, such as about 150 μm.

The PPI 111 may have an interconnect region 204 and a first region 202, e.g., a landing pad, underlying the UCM 115 that has a larger dimension in each direction than the PPI opening 108 and effectively, from this top-down point of view, surrounds the PPI opening 108 and the UCM 115 within the PPI opening 108. The PPI 111 may have a second length $L_2$ in one direction (e.g., parallel to the RDL longitudinal axis RL-RL') and a second width $W_2$ in another direction (e.g., parallel to the opening longitudinal axis OL-OL'). In an embodiment the second length $L_2$ may be the same as the second width $W_2$ or, alternatively, the second length $L_2$ may be larger than or smaller than the second width $W_2$. Additionally, the interconnect region 204 may have a third width $W_3$ less than the second width $W_2$, such as between about 60 μm and about 550 μm, such as about 300 μm.

As an example only, in the embodiment shown in FIG. 2, the second length $L_2$ of the PPI 111 may extend beyond the PPI opening 108 a first distance $A_1$, which may be between about 1 μm and about 200 μm, such as about 10 μm. In an opposite direction the second length $L_2$ of the PPI 111 may extend beyond the PPI opening 108 a second distance $A_2$, which may be between about 1 μm and about 200 μm, such as about 10 μm. As such, the second length $L_2$ of the PPI 111 may be equal to the first width $W_1$ of the PPI opening 108 plus the first distance $A_1$ and the second distance $A_2$.

Additionally, the second width $W_2$ of the first region 202 of the PPI 111 may extend a third distance $B_1$, which may be between about 1 μm and about 150 μm, such as about 10 μm. In an opposite direction parallel to the opening longitudinal axis OL-OL', the PPI 111 may extend a fourth distance $B_2$, which may be between about 1 μm and about 150 μm, such as about 10 μm. As such, the second width $W_2$ of the first region 202 of the PPI 111 may equal the first length $L_1$ of the PPI opening 108 plus the third distance $B_1$ and the fourth distance $B_2$.

In an embodiment the first distance $A_1$ and the second distance $A_2$ may be equal to each other, although alternatively they may not be equal to each other. Similarly, the third distance $B_1$ may be the same as the fourth distance $B_2$, although alternatively they may be different distances as well. However, in an embodiment the total of the sum of the first distance $A_1$ and the second distance $A_2$ is greater than the sum of the third distance $B_1$ and the fourth distance $B_2$. As such, the second length $L_2$ of the first region 202 of the PPI 111 may be the sum of the first width $W_1$ plus the first distance $A_1$ and the second distance $A_2$, while the second width $W_2$ of the first region 202 of the PPI 111 beneath the UCM 115 may be the sum of the first length $L_1$ plus the third distance $B_1$ and the fourth distance $B_2$.

By shaping the PPI opening 108 in the first region 202 such that extra material from the third passivation layer 113 is located along the RDL longitudinal axis RL-RL', the extra material from the third passivation layer 113 can effectively shield the underlying layers, such as the metallization layers 103 (see FIG. 1), that have a combination of metals and extremely low-k dielectric layers, from the peeling stresses along the RDL longitudinal axis RL-RL' that can occur during thermal processing. In particular, the extra material from the third passivation layer 113 can effectively shield the underlying layers from stresses generated by thermal expansion mismatches between the layers. As such, delamination of the layers is less likely to occur, and the overall yield of the manufacturing processes may be increased.

Figure 3:
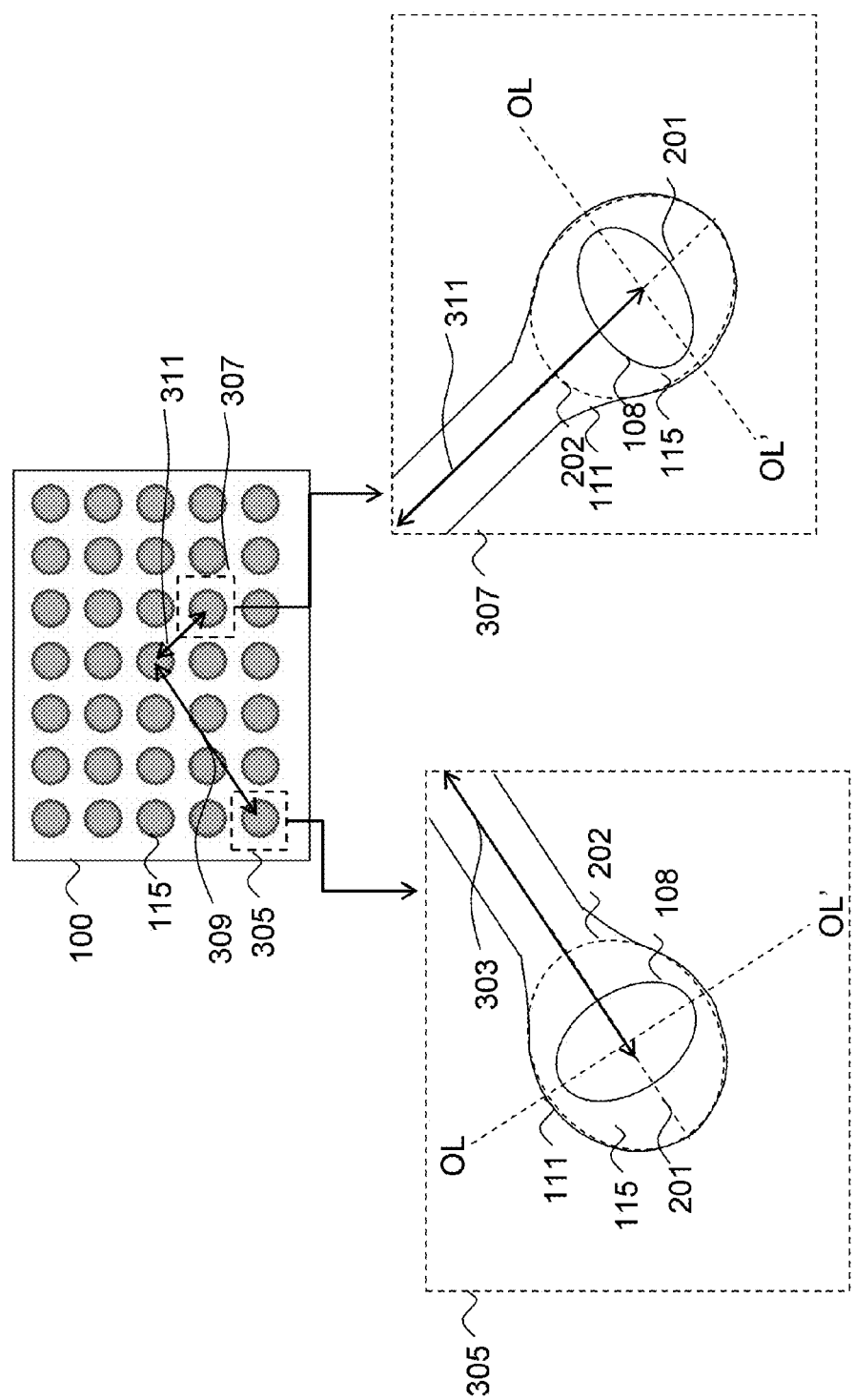
FIG. 3 illustrates a top-down view of an alignment of the post-passivation interconnect openings in accordance with an embodiment.

FIG. 3 illustrates a top down view of the semiconductor die 100 with a plurality of UCMs 115 located thereon (the top down view illustrates only the UCMs 115 located on the die while the first example 305 and second example 307 illustrate both the UCMs 115 as well as the PPIs 111 and the PPI openings 108). As illustrated, in an embodiment the opening longitudinal axis OL-OL' of the PPI openings 108 beneath the UCMs 115 may be aligned perpendicular to a direction of coefficient of thermal expansion mismatch (represented in FIG. 3 by line 303). As an example only, on the semiconductor die 100 the direction of coefficient of thermal expansion mismatch 303 radiates outward from the center of the semiconductor die 100. As such, for each one of the UCMs 115 illustrated in FIG. 3, the direction of coefficient of thermal expansion mismatch 303 may be determined by drawing a line (e.g., first line 309 and second line 311 in FIG. 3) from the center of the semiconductor die 100 to the center of the individual UCMs 115. Once the direction of coefficient of thermal expansion mismatch 303 for each of the individual UCMs 115 has been determined, the opening longitudinal axis OL-OL' of each of the PPIs 111 underlying each of the individual UCMs 115 may be aligned perpendicular to the direction of coefficient of thermal expansion mismatch 303.

Two examples of this are illustrated in FIG. 3, with a first example being represented by the dashed box 305 and a second example being represented by the dashed box 307. In the first example the UCM 115 is located along an outer edge of the semiconductor die 100, and the direction of coefficient of thermal expansion mismatch 303 may be determined by extending a first line 309 from the center of the semiconductor die 100 to a center of the UCM 115 within the dashed box 305. Once the direction of coefficient of thermal expansion mismatch 303 has been determined for the UCM 115 within the dashed box 307, the opening longitudinal axis OL-OL' of the PPI opening 108 may be aligned perpendicular to the direction of coefficient of thermal expansion mismatch 303, thereby helping to shield the underlying layers from stresses caused by differences in the coefficients of thermal expansion.

In the second example, similar to the first example, the direction of coefficient of thermal expansion mismatch 303 may be determined by extending a second line 311 from the center of the semiconductor die 100 to a center of the UCM 115 within the dashed box 307. Once the direction of coefficient of thermal expansion mismatch 303 has been determined for the UCM 115 within the dashed box 307, the opening longitudinal axis OL-OL' of the underlying PPI opening 108 may be aligned perpendicular to the direction of coefficient of thermal expansion mismatch 303, thereby also helping to shield the underlying layers from stresses caused by differences in the coefficients of thermal expansion.

However, as one of ordinary skill in the art will recognize, the above described method of determining the direction of coefficient of thermal expansion mismatch 303 is not the only method that may be used. Alternative methods, such as experimentally measuring the actual direction of coefficient of thermal expansion mismatch 303 under thermal processes may alternatively be utilized. These methods and any other suitable method may alternatively be used and are fully intended to be included within the scope of the present embodiments.

Figure 4A:
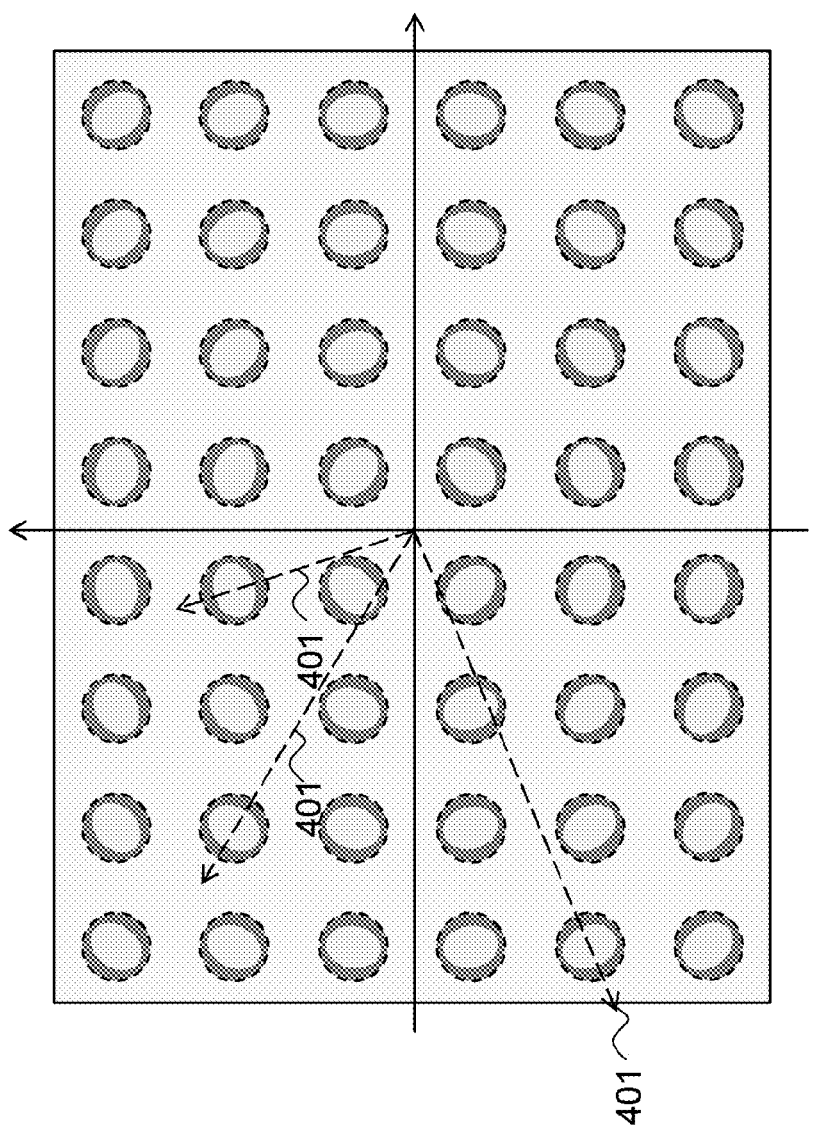
FIGS. 4A-4C illustrate layouts that may incorporate the post-passivation interconnect openings in accordance with an embodiment.
Figure 4C:
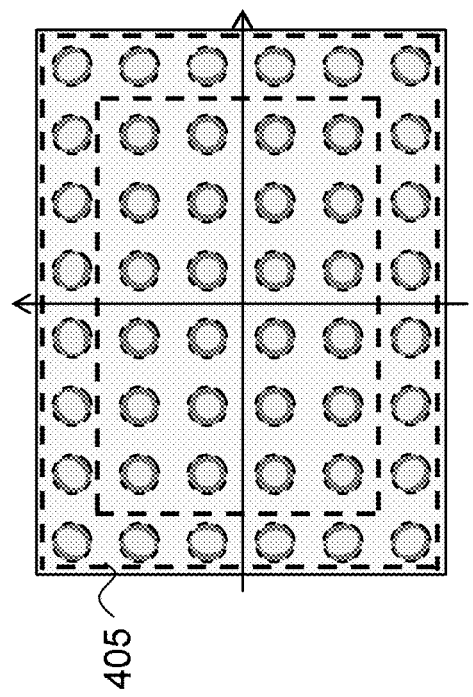
Figure 4B:
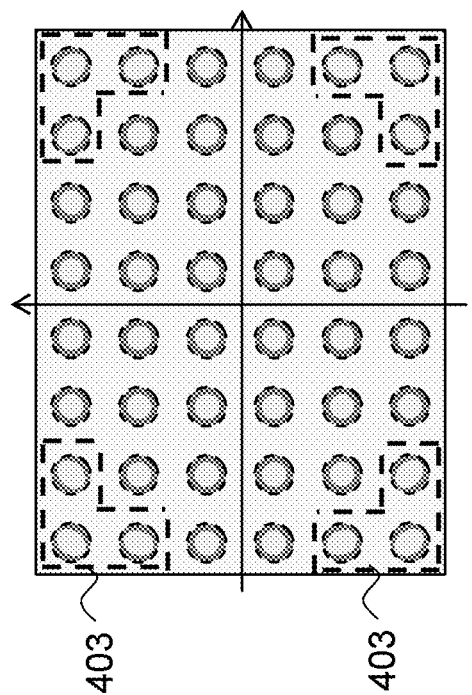

FIGS. 4A-4C illustrate different embodiments in which the PPI openings 108 may be aligned relative to the direction of coefficient of thermal expansion mismatch 303. In the first embodiment illustrated in FIG. 4A, each of the PPI openings 108 located on the semiconductor die 100 are each individually aligned to be perpendicular to the direction of coefficient of thermal expansion mismatch 303 (as illustrated by the three dashed lines 401). As such, each of the PPI openings 108 are aligned differently depending upon their location on the semiconductor die 100 and their location relative to the center of the semiconductor die 100.

FIG. 4B illustrates an embodiment in which only those PPI openings 108 located within corners regions 403 of the semiconductor die 100 are aligned perpendicular to the direction of coefficient of thermal expansion mismatch 303. In such an embodiment the remainder of the PPI openings 108 may be, e.g., circular openings, while the PPI openings 108 located within the corner regions 403 are aligned perpendicular to the direction of coefficient of thermal expansion mismatch 303. In an embodiment the corner regions may each comprise a PPI opening 108 located at a corner of the semiconductor die 100 along with adjacent PPI openings 108 that are also located along an edge of the semiconductor die 100, although the corner regions 403 may be any suitable shape to help prevent delamination of the underlying layers.

FIG. 4C illustrates another embodiment in which only those PPI openings 108 along an outer edge 405 of the semiconductor die 100 are aligned perpendicular to the direction of coefficient of thermal expansion mismatch 303, while the remainder of the PPI openings 108 may be, e.g., circular openings. In this embodiment the outer edge 405 may comprise an edge that is one PPI opening 108, but may also comprise an outer edge 405 that may have a thickness greater than one PPI opening 108, such as two PPI openings 108.

Figure 5:
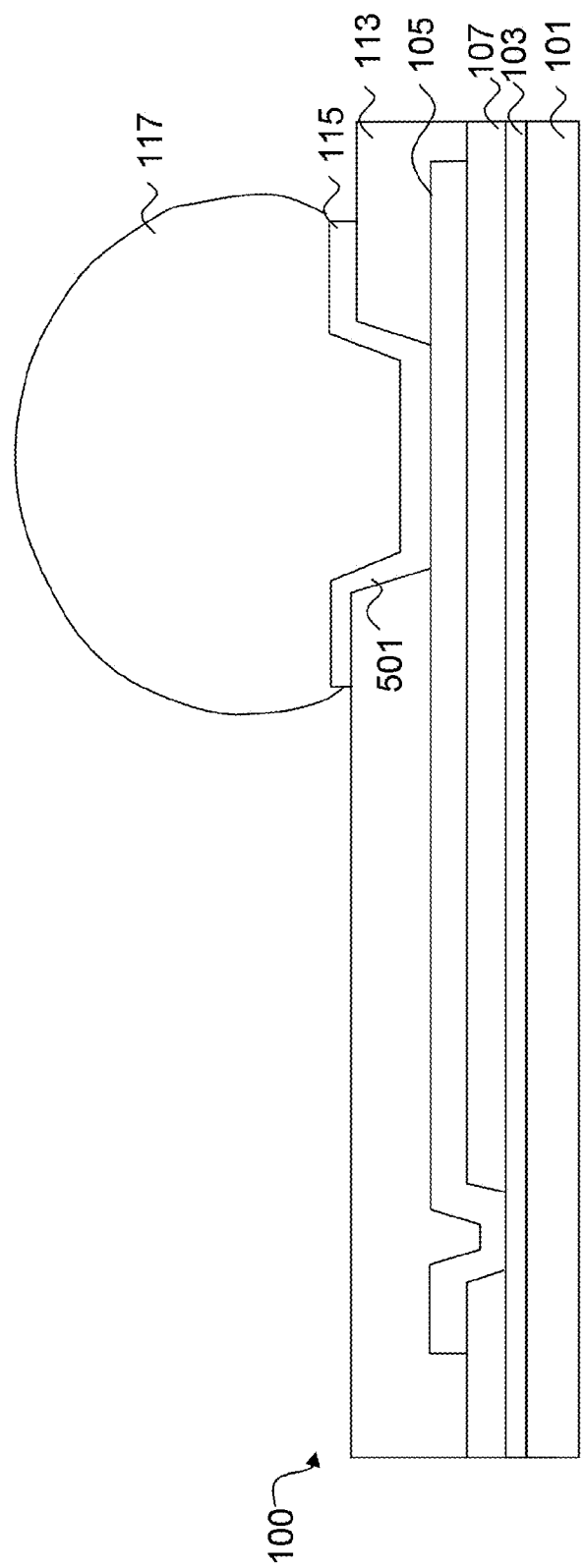
FIG. 5 illustrates another embodiment in which the opening exposes the contact pad in accordance with an embodiment.

FIG. 5 illustrates another embodiment in which the second passivation layer 109 and the PPI 111 are not formed on the substrate 101 and the metallization layers 103. Rather, the first passivation layer 107 may be formed over the metallization layers 103 prior to the formation of the contact pad 105. In an embodiment the first passivation layer 107 may be formed as described above with respect to FIG. 1, although other materials and methods may alternatively be utilized.

Once the first passivation layer 107 has been formed, the first passivation layer 107 may be patterned through, e.g., a suitable photolithographic masking and etching process, to expose a portion of the metallization layers 103. Once the portion of the metallization layers 103 has been exposed, the contact pad 105 may be formed through the first passivation layer 107 using similar materials and processes described above with respect to FIG. 1. Additionally in this embodiment the contact pad 105 may be formed to extend along the first passivation layer 107, acting like a redistribution layer and replacing the need for the PPI 111, which may not be formed in this embodiment.

After the contact pad 105 has been formed to extend along the first passivation layer 107, the third passivation layer 113 may be formed over the contact pad 105 using materials and processes similar to those described above with respect to FIG. 1, and the third passivation layer 113 may be patterned to form a contact pad opening 501 through the third passivation layer 113. The contact pad opening 501 may be formed and shaped similar to the formation and shaping of the PPI opening 108 described above with respect to FIGS. 1-4C. For example, the contact pad opening 501 may be shaped to have the first length $L_1$ and the first width $W_1$ as described above with respect to FIG. 2. Additionally, the first length $L_1$ of the contact pad opening 501 may also be aligned perpendicularly with a direction of coefficient of thermal expansion mismatch of the substrate 101.

By forming the contact pad opening 501 to expose the contact pad 105, the contact pad opening 501 may be utilized to help shield the underlying layers at the level of the contact pad 105. Additionally, the second passivation layer 109 and the PPI 111 may not be utilized in this embodiment, and may be removed. Without these additional layers of materials, the overall manufacturing process may be simplified and made more efficient.

In accordance with an embodiment, a semiconductor device comprising a post-passivation layer over a substrate, the substrate having a first direction of coefficient of thermal expansion mismatch, is provided. A first opening is through the post-passivation layer, the first opening having a first dimension and a second dimension less than the first dimension, wherein the first dimension is aligned perpendicular to the first direction of coefficient of thermal expansion mismatch.

In accordance with another embodiment, semiconductor device comprising a dielectric layer over a substrate is provided. A first opening is through the dielectric layer, the first opening having a first dimension larger than a second dimension, the first dimension and second dimension being parallel to a major surface of the substrate, wherein the first dimension is aligned perpendicular to a first line extending between a center of the substrate and a center of the first opening. A first undercontact metallization extends into the first opening.

In accordance with yet another embodiment, a method of manufacturing a semiconductor device comprising forming a passivation layer on a substrate, the substrate having a first direction of coefficient of thermal expansion mismatch, is provided. A first opening is formed through the passivation layer, the first opening having a first length greater than a first width, the first length aligned perpendicularly with the first direction of coefficient of thermal expansion mismatch. An undercontact metallization is formed in the first opening Although the present embodiments and their advantages have been described in detail, it should be understood that various changes, substitutions and alterations can be made herein without departing from the spirit and scope of the embodiments as defined by the appended claims. For example, the precise shape of the corner regions or outer edge may be modified, or the methodology for determining the direction of coefficient of thermal expansion mismatch may be changed, while still remaining with the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A semiconductor device comprising:
   a semiconductor substrate having active devices thereon;
   a first post-passivation interconnect over the active devices, the semiconductor substrate having a first direction of coefficient of thermal expansion mismatch and a first quadrant, wherein the first post-passivation interconnect comprises:
      a first interconnect region, the first interconnect region in line with the first direction of coefficient of thermal expansion mismatch; and
      a first landing pad in physical connection with the first interconnect region, the first landing pad having an elliptical shape in plan view;
   a second post-passivation interconnect over the active devices, wherein the second post-passivation interconnect comprises:
      a second interconnect region; and
      a second landing pad in physical connection with the second interconnect region;
   a post-passivation layer over the first post-passivation interconnect and the second post-passivation interconnect;
   a first opening through the post-passivation layer directly over the first landing pad, the first opening having a first dimension and a second dimension, the second dimension being less than the first dimension, wherein the first dimension and the second dimension are both in a plane parallel with a major surface of the semiconductor substrate, wherein the first dimension is aligned perpendicular to the first direction of coefficient of thermal expansion mismatch, wherein in a plan view the first landing pad extends beyond the first opening in a third direction a first distance and extends beyond the first opening in a fourth direction opposite the third direction a second distance, wherein the third direction and the fourth direction are perpendicular to a length of the first post-passivation interconnect and parallel to a width of the first post-passivation interconnect in the plan view, wherein in plan view the first landing pad extends beyond the first opening in a fifth direction a third distance and extends beyond the first opening in a sixth direction opposite the fifth direction a fourth distance, wherein the fifth direction and sixth direction are parallel to the length of the first post-passivation interconnect and perpendicular to the width of the first post-passivation interconnect in plan view, wherein the third direction and the fourth direction are perpendicular to the second dimension of the first opening, wherein a first sum of the third distance, fourth distance, and second dimension is greater than a second sum of the first distance, second distance, and first dimension; and
   a second opening through the post-passivation layer directly over the second landing pad, wherein the first opening and the second opening are both located in the first quadrant, the second opening having a third dimension and a fourth dimension, wherein the fourth dimension is less than the third dimension, wherein the third dimension and the fourth dimension are both in a plane parallel with the major surface of the semiconductor substrate, wherein the third dimension is not parallel with the first dimension, wherein the third dimension is aligned perpendicular to a second direction of coefficient of thermal expansion mismatch different from the first direction of coefficient of thermal expansion mismatch,
   wherein the first opening is filled with a first material.

2. The semiconductor device of claim 1, wherein the first material comprises an undercontact metallization layer extending through the first opening.

3. The semiconductor device of claim 1, further comprising a third opening through the post-passivation layer, the third opening being circular in shape.

4. The semiconductor device of claim 1, wherein the first opening is located along an edge of the semiconductor substrate.

5. The semiconductor device of claim 4, wherein the first opening is located at a corner region of the semiconductor substrate and the second opening is located along the edge of the semiconductor substrate.

6. The semiconductor device of claim 4, wherein the second opening is located within an interior region of the semiconductor substrate.

7. A semiconductor device comprising:
   a semiconductor substrate having a plurality of active devices thereon;
   a metallization layer coupled to at least one of the active devices;
   a contact pad disposed on the metallization layer;
   a first passivation layer over the contact pad and metallization layer, the first passivation layer being non-planar and conformal to the contact pad;
   a first pad opening being formed in the first passivation layer over the contact pad and reaching the contact pad;
   a second passivation layer over the first passivation layer, the second passivation layer being planar;
   a second pad opening being formed in the second passivation layer over the contact pad and reaching the contact pad, the second pad opening being within and smaller in a width dimension in cross-section than the first pad opening;
   a post-passivation interconnect over the plurality of active devices, formed over the second passivation layer, and coupled to the contact pad, the post-passivation interconnect comprising:
   a first region having a substantially uniform width in a top down view; and
   a landing pad in physical contact and substantially level with the first region and having a non-uniform width in the top down view, the first region electrically coupling the landing pad to the plurality of active devices, the landing pad being elliptical in plan view having a length and width, the length being greater than the width;
   a dielectric layer over the post-passivation interconnect;

a first opening through the dielectric layer, wherein the first opening extends to the landing pad, the first opening having a first dimension larger than a second dimension, the first dimension and second dimension being parallel to a major surface of the semiconductor substrate, wherein the first dimension is aligned perpendicular to a first line extending between a center of the semiconductor substrate and a center of the first opening, and wherein the length of the landing pad is within the first line; and a first undercontact metallization extending into the first opening, the first undercontact metallization being configured to have a solder material formed thereon, the first undercontact metallization extending over an uppermost portion of the dielectric layer, wherein the first undercontact metallization extends to a bottom of the first opening but does not extend between the dielectric layer and the semiconductor substrate.

8. The semiconductor device of claim 7, further comprising a second opening through the dielectric layer, the second opening having a circular shape.

9. The semiconductor device of claim 8, wherein the first opening is located along an outer edge of the semiconductor substrate and the second opening is located within an interior region of the semiconductor substrate.

10. The semiconductor device of claim 8, wherein the first opening is located along an outer edge of the semiconductor substrate and the second opening is located along the outer edge of the semiconductor substrate.

11. The semiconductor device of claim 10, wherein the first opening is located in a corner region of the semiconductor substrate.

12. The semiconductor device of claim 7, further comprising a second opening through the dielectric layer, the second opening having a third dimension larger than a fourth dimension, the third dimension and fourth dimension being parallel to the major surface of the semiconductor substrate, wherein the third dimension is aligned perpendicular to a second line extending between the center of the semiconductor substrate and a center of the second opening.

13. A method of manufacturing a semiconductor device, the method comprising:
    forming a passivation layer on a semiconductor substrate, the semiconductor substrate having a plurality of active devices thereon, the plurality of active devices being interposed between the passivation layer and the semiconductor substrate, the semiconductor substrate having a first direction of coefficient of thermal expansion mismatch and a second direction of coefficient of thermal expansion mismatch different from the first direction of coefficient of thermal expansion mismatch;
    forming a first opening through the passivation layer after the passivation layer has been completely formed, the first opening having a first length along a first line greater than a first width along a second line, the first length aligned perpendicularly with the first direction of coefficient of thermal expansion mismatch;
    forming an undercontact metallization in the first opening and extending over a portion of the passivation layer, wherein the undercontact metallization is in physical contact with a landing pad of a post-passivation interconnect, the landing pad having an elliptical shape in a plan view and located between the passivation layer and the semiconductor substrate, wherein in plan view the landing pad extends from the first opening along the second line further than a circle with a diameter defined by a width of the landing pad along the first line, wherein the width of the landing pad along the first line is greater than the first length of the first opening, wherein the post-passivation interconnect electrically couples the undercontact metallization to the plurality of active devices; and
    forming a second opening through the passivation layer in a same quadrant as the first opening, the second opening having a second length greater than a second width, the second length aligned with the second direction of coefficient of thermal expansion mismatch.

14. The method of claim 13, wherein the first direction of coefficient of thermal expansion mismatch is aligned with a line between a center of the first opening and a center of the semiconductor substrate.

15. The method of claim 13, further comprising forming a third opening through the passivation layer, the third opening having a circular shape.

16. The method of claim 15, wherein the first opening is located along an outer edge of the semiconductor substrate.

17. The method of claim 15, wherein the first opening is located in a corner region of the semiconductor substrate.

18. The method of claim 13, further comprising testing to determine the first direction of coefficient of thermal expansion mismatch.

19. The semiconductor device of claim 1, wherein the first material does not exist between the post-passivation layer and the semiconductor substrate.

20. The semiconductor device of claim 1, and wherein the first material extends over the first opening and has a different shape than the first opening in the plan view.

* * * * *